United States Patent
Yu et al.

(10) Patent No.: US 8,101,970 B2
(45) Date of Patent: Jan. 24, 2012

(54) SEMICONDUCTOR DEVICE

(75) Inventors: Jing-Chi Yu, Hsinchu (TW); Yu-Lun Lu, Yilan County (TW)

(73) Assignee: ILI Technology Corp., Jhubei, Hsinchu County (TW)

( * ) Notice: Subject to any disclaimer, the term of this patent is extended or adjusted under 35 U.S.C. 154(b) by 428 days.

(21) Appl. No.: 12/539,617

(22) Filed: Aug. 12, 2009

(65) Prior Publication Data

US 2011/0006396 A1    Jan. 13, 2011

(30) Foreign Application Priority Data

Jul. 9, 2009    (TW) ............................... 98123217 A

(51) Int. Cl.
    *H01L 27/07*    (2006.01)
(52) U.S. Cl. .. 257/173; 257/362; 257/477; 257/E29.338
(58) Field of Classification Search .................. 257/173, 257/362, 477, E29.338
    See application file for complete search history.

(56) References Cited

U.S. PATENT DOCUMENTS

| | | | |
|---|---|---|---|
| 6,784,489 B1* | 8/2004 | Menegoli | 257/343 |
| 2010/0208399 A1* | 8/2010 | Yu et al. | 361/56 |

* cited by examiner

*Primary Examiner* — Minh-Loan T Tran
(74) *Attorney, Agent, or Firm* — Winston Hsu; Scott Margo

(57) ABSTRACT

A semiconductor device of the present invention comprises: a P type semiconductor substrate, an N-well, a first P+ diffusion region, a second P+ diffusion region, a Schottky diode, a first N+ diffusion region, a second N+ diffusion region, a third P+ diffusion region, a fourth P+ diffusion region, a first insulation layer, a second insulation layer, a first parasitic bipolar junction transistor (BJT), and a second parasitic BJT. The Schottky diode is coupled to an input signal. The first N+ diffusion region and the second N+ diffusion region are coupled to a voltage source, respectively. When a voltage level of the input signal is higher than a voltage level of the voltage source, the Schottky diode conducts charges to make the first parasitic BJT and the second parasitic BJT not conducted.

8 Claims, 6 Drawing Sheets

SEMICONDUCTOR DEVICE

BACKGROUND OF THE INVENTION

1. Field of the Invention

The present invention relates to a semiconductor device, and more particularly, to a semiconductor device that can prevent the latch-up phenomenon from happening.

2. Description of the Prior Art

Please refer to FIG. 1. FIG. 1 shows a simplified diagram of a conventional semiconductor device 100. As shown in FIG. 1, the semiconductor device 100 comprises: a P type semiconductor substrate 102, an N-well 104, a first P+ diffusion region 106, a first N+ diffusion region 108, a second N+ diffusion region 110, a second P+ diffusion region 112, a third P+ diffusion region 114, a first insulation layer 116, a second insulation layer 118, a first parasitic bipolar junction transistor (BJT) 120, and a second parasitic BJT 122. The N-well 104 is positioned in the P type semiconductor substrate 102. The first P+ diffusion region 106 is positioned in the N-well 104. The first P+ diffusion region 106 is coupled to an input signal VDD1. The first N+ diffusion region 108 and the second N+ diffusion region 110 are positioned in the N-well 104, and utilized for coupled to a voltage source VDD2, respectively. The second P+ diffusion region 112 and the third P+ diffusion region 114 are positioned in the P type semiconductor substrate 102, and utilized for coupled to a voltage level VSS1, respectively. The first insulation layer 116 is positioned between the first N+ diffusion region 108 and the second P+ diffusion region 112. The second insulation layer 118 is positioned between the second N+ diffusion region 110 and the third P+ diffusion region 114. The first parasitic BJT 120 has an emitter, a base, and a collector, wherein the emitter of the first parasitic BJT 120 is formed by the first P+ diffusion region 106, the base of the first parasitic BJT 120 is formed by the N-well 104 connected to the first N+ diffusion region 108, and the collector of the first parasitic BJT 120 is formed by the P type semiconductor substrate 102 connected to the second P+ diffusion region 112. The second parasitic BJT 122 has an emitter, a base, and a collector, wherein the emitter of the second parasitic BJT 122 is formed by the first P+ diffusion region 106, the base of the second parasitic BJT 122 is formed by the N-well 104 connected to the second N+ diffusion region 110, and the collector of the second parasitic BJT 122 is formed by the P type semiconductor substrate 102 connected to the third P+ diffusion region 114.

Please refer to FIG. 2. FIG. 2 shows a timing diagram of the voltage level VSS1, the input signal VDD1, and the voltage source VDD2 in FIG. 1. As shown in FIG. 2, the voltage level lifting speed of the input signal VDD1 is faster than the voltage level lifting speed of the voltage source VDD2, and thus when the voltage level of the input signal VDD1 is higher than the voltage level of the voltage source VDD2, the first parasitic BJT 120 and the second parasitic BJT 122 will be conducted, and a latch-up phenomenon will appear. In this way, a large current will be generated to damage the semiconductor device 100 easily.

SUMMARY OF THE INVENTION

It is therefore one of the objectives of the present invention to provide a semiconductor device that can prevent the latch-up phenomenon from happening, so as to solve the above problems.

In accordance with an embodiment of the present invention, a semiconductor device is disclosed. The semiconductor device comprises: a P type semiconductor substrate, an N-well, a first P+ diffusion region, a second P+ diffusion region, a Schottky diode, a first N+ diffusion region, a second N+ diffusion region, a third P+ diffusion region, a fourth P+ diffusion region, a first insulation layer, a second insulation layer, a first parasitic bipolar junction transistor (BJT), and a second parasitic BJT. The N-well is positioned in the P type semiconductor substrate. The first P+ diffusion region and the second P+ diffusion region are positioned in the N-well. The Schottky diode is positioned in the N-well, and utilized for coupled to an input signal. The first N+ diffusion region and the second N+ diffusion region are positioned in the N-well, and utilized for coupled to a voltage source, respectively. The third P+ diffusion region and the fourth P+ diffusion region are positioned in the P type semiconductor substrate. The first insulation layer is positioned between the first N+ diffusion region and the third P+ diffusion region. The second insulation layer is positioned between the second N+ diffusion region and the fourth P+ diffusion region. The first parasitic BJT has an emitter, a base, and a collector, wherein the emitter of the first parasitic BJT is formed by the first P+ diffusion region, the base of the first parasitic BJT is formed by the N-well connected to the first N+ diffusion region, and the collector of the first parasitic BJT is formed by the P type semiconductor substrate connected to the third P+ diffusion region. The second parasitic BJT has an emitter, a base, and a collector, wherein the emitter of the second parasitic BJT is formed by the second P+ diffusion region, the base of the second parasitic BJT is formed by the N-well connected to the second N+ diffusion region, and the collector of the second parasitic BJT is formed by the P type semiconductor substrate connected to the fourth P+ diffusion region. When a voltage level of the input signal is higher than a voltage level of the voltage source, the Schottky diode conducts charges to make the first parasitic BJT and the second parasitic BJT not conducted.

In accordance with an embodiment of the present invention, a semiconductor device is further disclosed. The semiconductor device comprises: a N type semiconductor substrate, an P-well, a first N+ diffusion region, a second N+ diffusion region, a Schottky diode, a first P+ diffusion region, a second P+ diffusion region, a third N+ diffusion region, a fourth N+ diffusion region, a first insulation layer, a second insulation layer, a first parasitic bipolar junction transistor (BJT), and a second parasitic BJT. The P-well is positioned in the N type semiconductor substrate. The first N+ diffusion region and the second N+ diffusion region are positioned in the P-well. The Schottky diode is positioned in the P-well, and utilized for coupled to an input signal. The first P+ diffusion region and the second P+ diffusion region are positioned in the P-well, and utilized for coupled to a voltage source, respectively. The third N+ diffusion region and the fourth N+ diffusion region are positioned in the N type semiconductor substrate. The first insulation layer is positioned between the first P+ diffusion region and the third N+ diffusion region. The second insulation layer is positioned between the second P+ diffusion region and the fourth N+ diffusion region. The first parasitic BJT has an emitter, a base, and a collector, wherein the emitter of the first parasitic BJT is formed by the first N+ diffusion region, the base of the first parasitic BJT is formed by the P-well connected to the first P+ diffusion region, and the collector of the first parasitic BJT is formed by the N type semiconductor substrate connected to the third N+ diffusion region. The second parasitic BJT has an emitter, a base, and a collector, wherein the emitter of the second parasitic BJT is formed by the second N+ diffusion region, the base of the second parasitic BJT is formed by the P-well connected to the second P+ diffusion region, and the collector of the second parasitic BJT is formed by the N type semiconductor substrate connected to the fourth N+ diffusion region. When a voltage level of the input signal is lower than a voltage level of the voltage source, the Schottky diode conducts charges to make the first parasitic BJT and the second parasitic BJT not conducted.

Brief summarized, the semiconductor device disclosed by the present invention can prevent the latch-up phenomenon from happening, and thus it is not easy for the semiconductor device of the present invention to be damaged, and the semiconductor device of the present invention has a longer lifetime.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and the claims to refer to particular system components. As one skilled in the art will appreciate, manufacturers may refer to a component by different names. This document does not intend to distinguish between components that differ in name but not function. In the following discussion and in the claims, the terms "include", "including", "comprise", and "comprising" are used in an open-ended fashion, and thus should be interpreted to mean "including, but not limited to . . ." The terms "couple" and "coupled" are intended to mean either an indirect or a direct electrical connection. Thus, if a first device couples to a second device, that connection may be through a direct electrical connection, or through an indirect electrical connection via other devices and connections.

Figure 1:
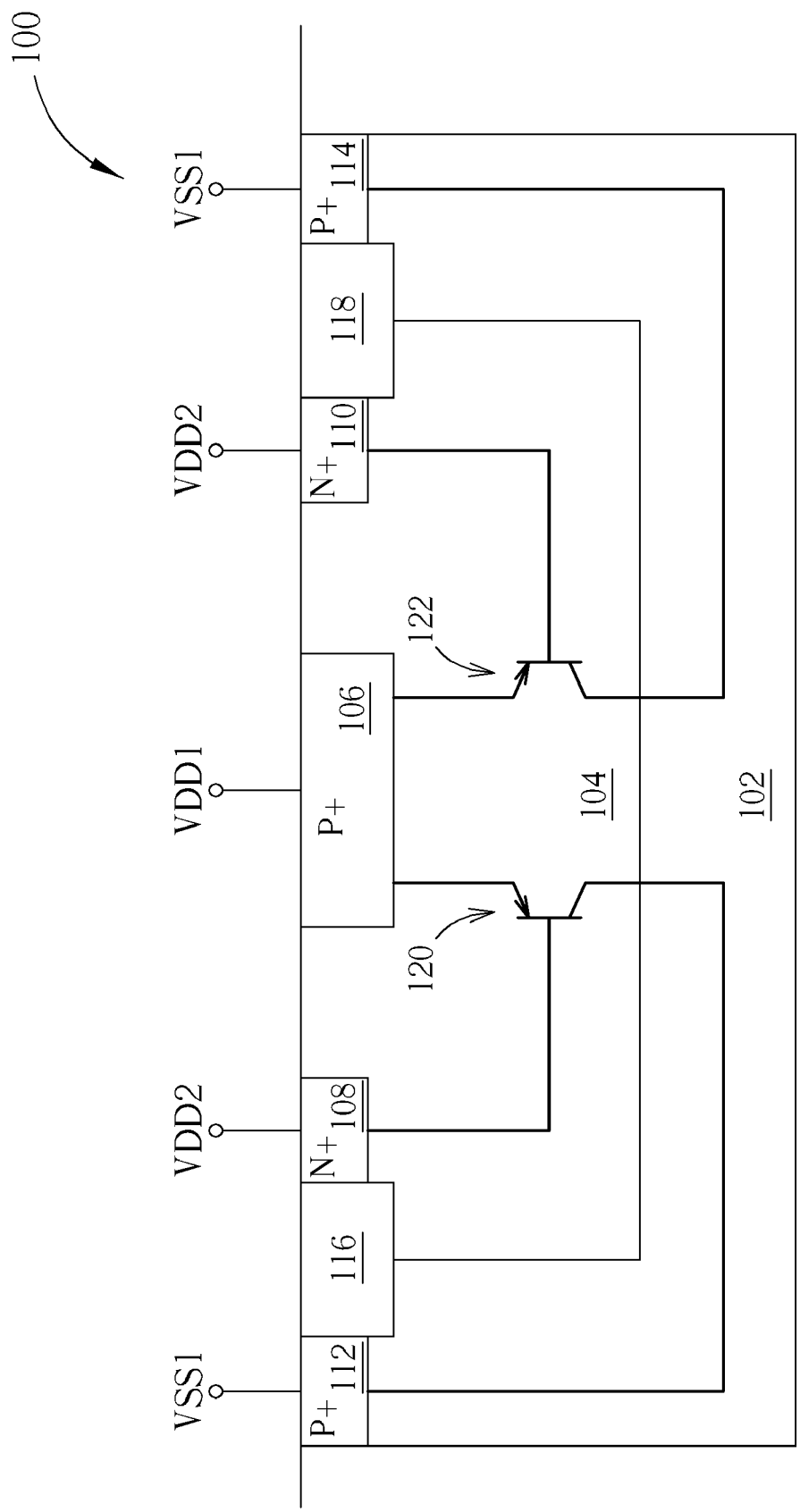
FIG. 1 shows a simplified diagram of a conventional semiconductor device.
Figure 2:
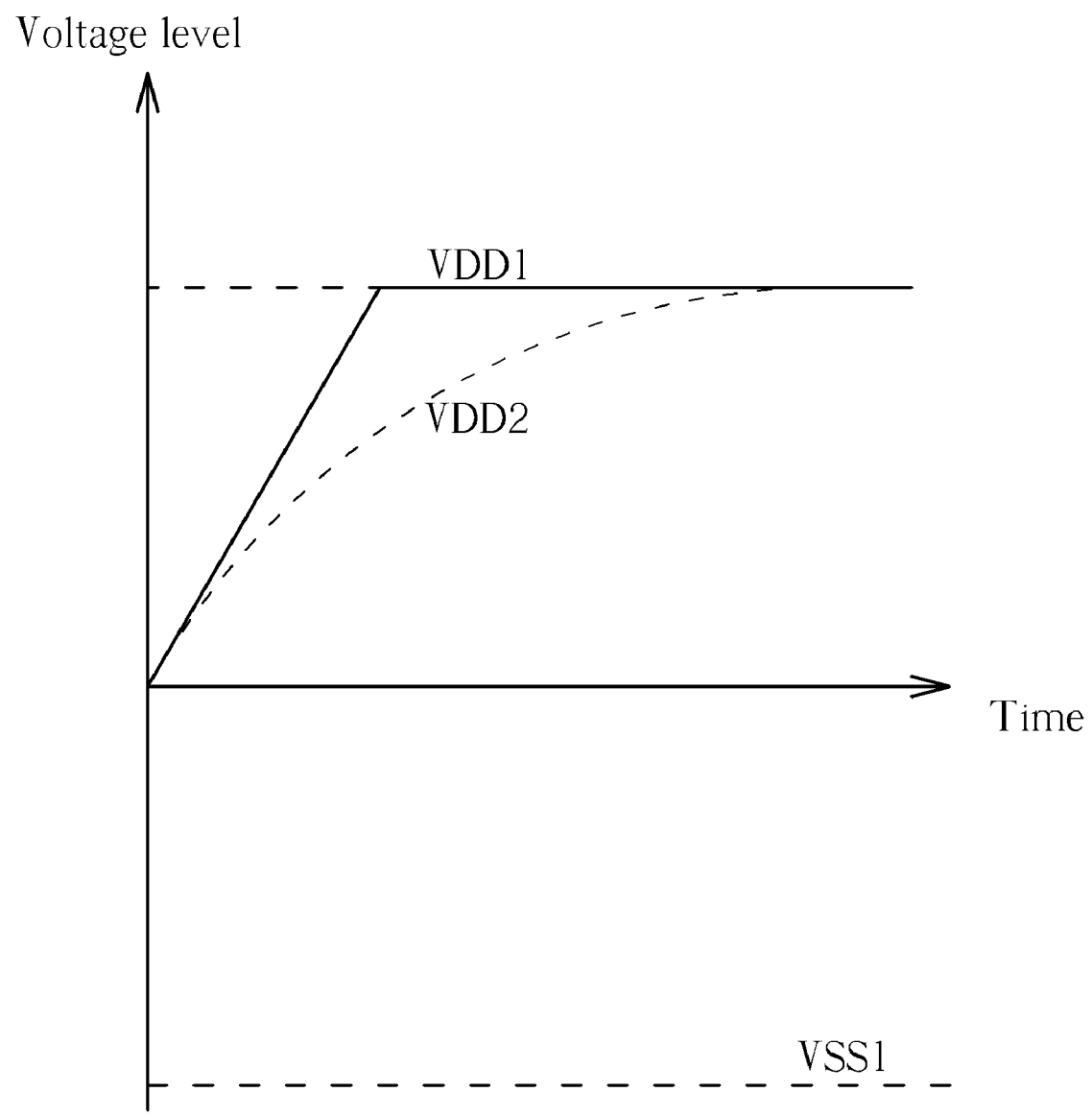
FIG. 2 shows a timing diagram of the voltage level VSS1, the input signal VDD1, and the voltage source VDD2 in FIG. 1.
Figure 3:
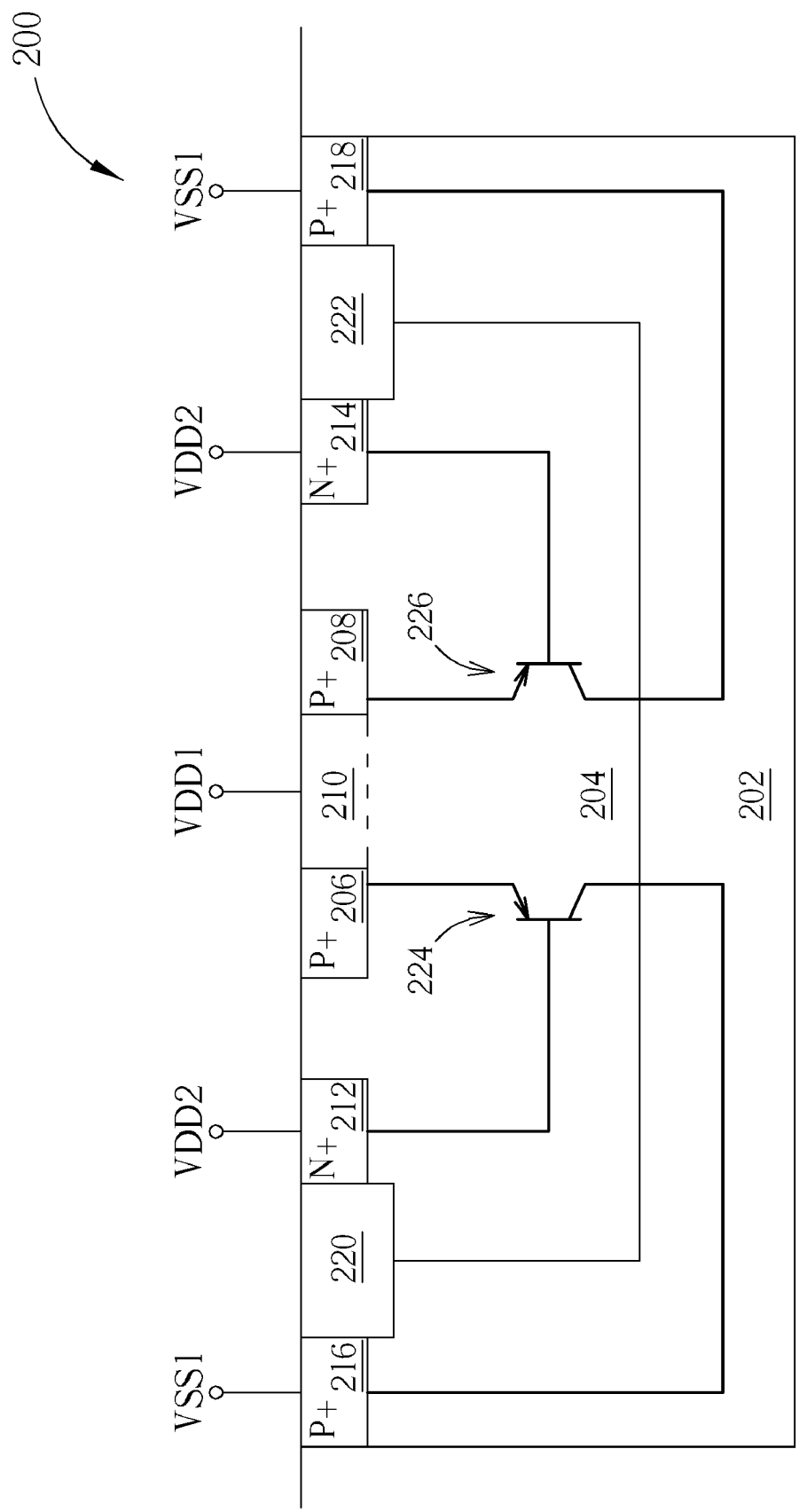
FIG. 3 shows a simplified diagram of a semiconductor device in accordance with a first embodiment of the present invention.

Please refer to FIG. 3. FIG. 3 shows a simplified diagram of a semiconductor device 200 in accordance with a first embodiment of the present invention, wherein the semiconductor device 200 is fabricated by a logic process. As shown in FIG. 3, the semiconductor device 200 comprises: a P type semiconductor substrate 202, an N-well 204, a first P+ diffusion region 206, a second P+ diffusion region 208, a Schottky diode 210, a first N+ diffusion region 212, a second N+ diffusion region 214, a third P+ diffusion region 216, a fourth P+ diffusion region 218, a first insulation layer 220, a second insulation layer 222, a first parasitic bipolar junction transistor (BJT) 224, and a second parasitic BJT 226. The N-well 204 is positioned in the P type semiconductor substrate 202. The first P+ diffusion region 206 and the second P+ diffusion region 208 are positioned in the N-well 204. The Schottky diode 210 is positioned between the first P+ diffusion region 206 and the second P+ diffusion region 208, and utilized for coupled to an input signal VDD1. The first N+ diffusion region 212 and the second N+ diffusion region 214 are positioned in the N-well 204, and utilized for coupled to a voltage source VDD2, respectively. The third P+ diffusion region 216 and the fourth P+ diffusion region 218 are positioned in the P type semiconductor substrate 202, and utilized for coupled to a voltage level VSS1, respectively. The first insulation layer 220 is positioned between the first N+ diffusion region 212 and the third P+ diffusion region 216. The second insulation layer 222 is positioned between the second N+ diffusion region 214 and the fourth P+ diffusion region 218. The first parasitic BJT 224 has an emitter, a base, and a collector, wherein the emitter of the first parasitic BJT 224 is formed by the first P+ diffusion region 206, the base of the first parasitic BJT 224 is formed by the N-well 204 connected to the first N+ diffusion region 212, and the collector of the first parasitic BJT 224 is formed by the P type semiconductor substrate 202 connected to the third P+ diffusion region 216. The second parasitic BJT 226 has an emitter, a base, and a collector, wherein the emitter of the second parasitic BJT 226 is formed by the second P+ diffusion region 208, the base of the second parasitic BJT 226 is formed by the N-well 204 connected to the second N+ diffusion region 214, and the collector of the second parasitic BJT 226 is formed by the P type semiconductor substrate 202 connected to the fourth P+ diffusion region 218. In addition, please note that the above embodiment is only for an illustrative purpose and is not meant to be a limitation of the present invention. For example, the Schottky diode 210 is not limited to be positioned between the first P+ diffusion region 206 and the second P+ diffusion region 208, and the Schottky diode 210 also can be positioned in other positions of the N-well 204.

Figure 4:
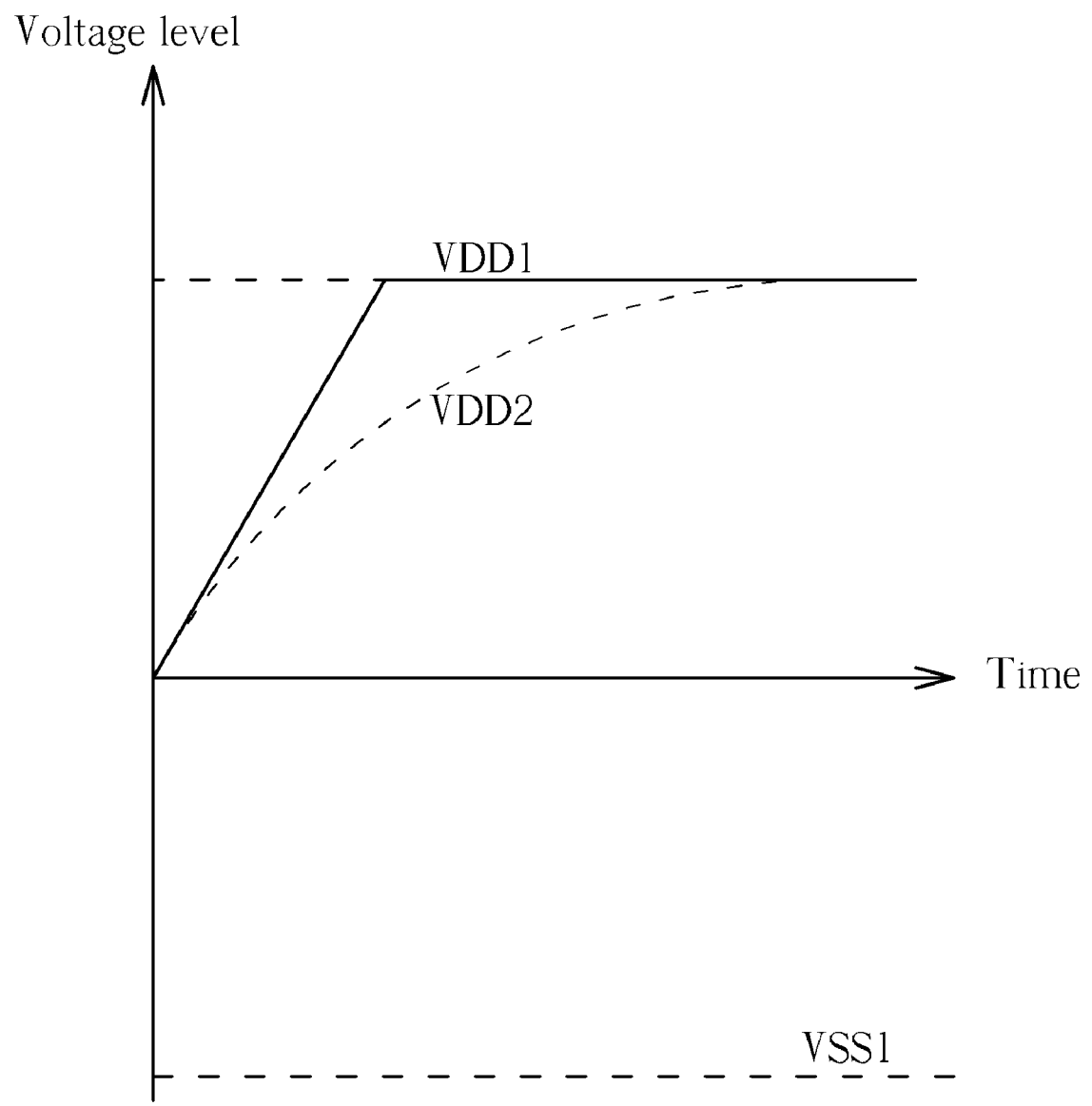
FIG. 4 shows a timing diagram of the voltage level VSS1, the input signal VDD1, and the voltage source VDD2 in the first embodiment of the present invention.

Please refer to FIG. 4. FIG. 4 shows a timing diagram of the voltage level VSS1, the input signal VDD1, and the voltage source VDD2 in the first embodiment of the present invention. As shown in FIG. 4, the voltage level lifting speed of the input signal VDD1 is faster than the voltage level lifting speed of the voltage source VDD2. However, the forward bias threshold voltage of the Schottky diode 210 in the semiconductor device 200 of the present invention (such as 0.4V) is lower than the forward bias threshold voltages of the first parasitic BJT 224 and the second parasitic BJT 226 (such as 0.7V), and thus when the voltage level of the input signal VDD1 is higher than the voltage level of the voltage source VDD2, the present invention can utilize the Schottky diode 210 to conduct charges so as to make the first parasitic BJT 224 and the second parasitic BJT 226 not conducted. In this way, the semiconductor device 200 of the present invention can prevent the latch-up phenomenon from happening, and thus it is not easy for the semiconductor device 200 of the present invention to be damaged, and the semiconductor device 200 of the present invention has a longer lifetime. In addition, please note that the above embodiment is only for an illustrative purpose and is not meant to be a limitation of the present invention. For example, the concept of the present invention also can be utilized in the semiconductor devices fabricated by other semiconductor processes (such as a high voltage process).

Figure 5:
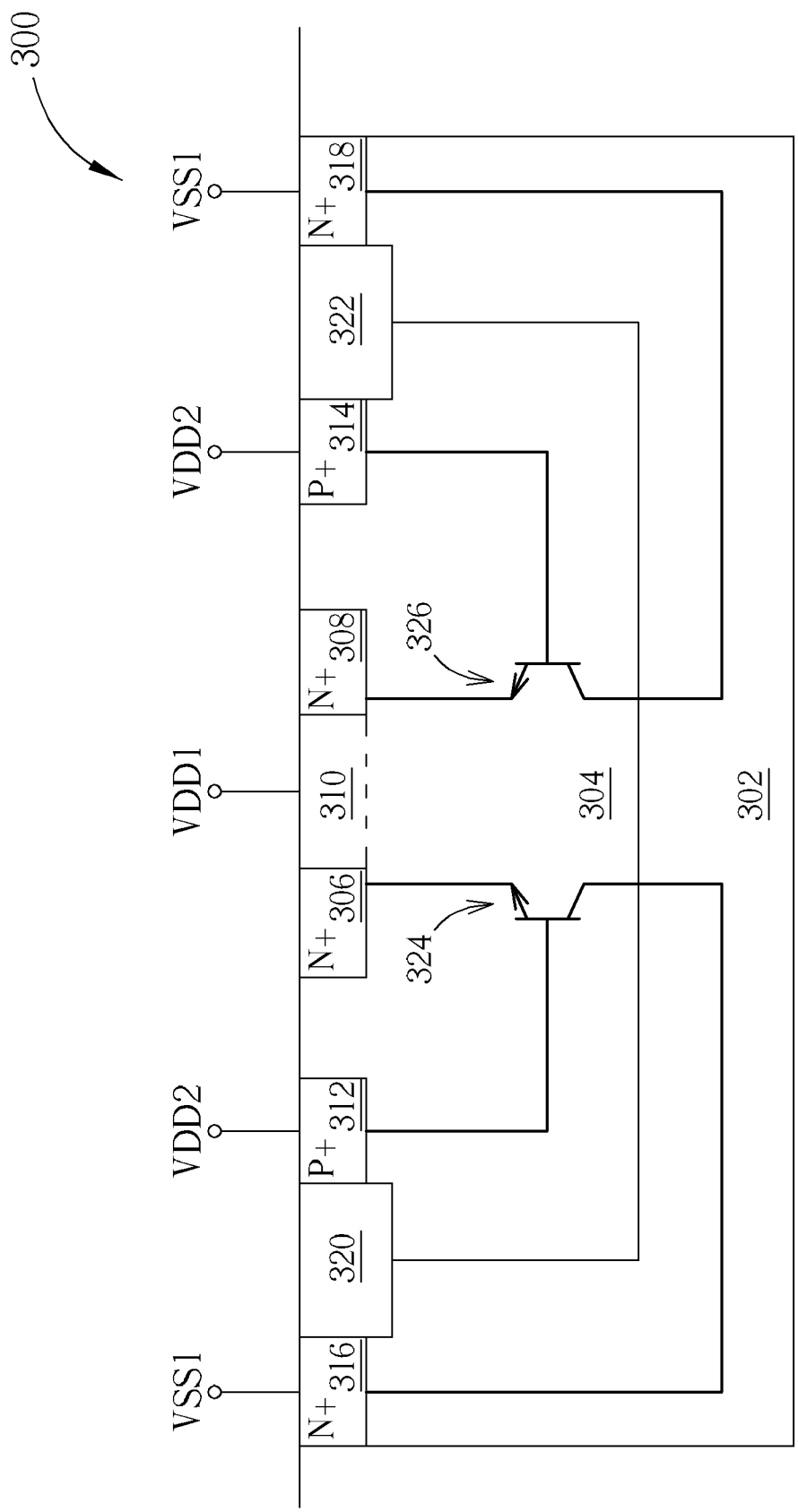
FIG. 5 shows a simplified diagram of a semiconductor device in accordance with a second embodiment of the present invention.

Please refer to FIG. 5. FIG. 5 shows a simplified diagram of a semiconductor device 300 in accordance with a second embodiment of the present invention, wherein the semiconductor device 300 is fabricated by a logic process. As shown in FIG. 5, the semiconductor device 300 comprises: a N type semiconductor substrate 302, an P-well 304, a first N+ diffusion region 306, a second N+ diffusion region 308, a Schottky diode 310, a first P+ diffusion region 312, a second P+ diffusion region 314, a third N+ diffusion region 316, a fourth N+ diffusion region 318, a first insulation layer 320, a second insulation layer 322, a first parasitic BJT 324, and a second parasitic BJT 326. The P-well 304 is positioned in the N type semiconductor substrate 302. The first N+ diffusion region 306 and the second N+ diffusion region 308 are positioned in the P-well 304. The Schottky diode 310 is positioned in the P-well 304, and utilized for coupled to an input signal VDD1. The first P+ diffusion region 312 and the second P+ diffusion region 314 are positioned in the P-well 304, and utilized for coupled to a voltage source VDD2, respectively. The third N+ diffusion region 316 and the fourth N+ diffusion region 318 are positioned in the N type semiconductor substrate 302, and utilized for coupled to a voltage level VSS1, respectively. The first insulation layer 320 is positioned between the first P+ diffusion region 312 and the third N+ diffusion region 316. The second insulation layer 322 is positioned between the second P+ diffusion region 314 and the fourth N+ diffusion region 318. The first parasitic BJT 324 has an emitter, a base, and a collector, wherein the emitter of the first parasitic BJT 324 is formed by the first N+ diffusion region 306, the base of the first parasitic BJT 324 is formed by the P-well 304 connected to the first P+ diffusion region 312, and the collector of the first parasitic BJT 324 is formed by the N type semiconductor substrate 302 connected to the third N+ diffusion region 316. The second parasitic BJT 326 has an emitter, a base, and a collector, wherein the emitter of the second parasitic BJT 326 is formed by the second N+ diffusion region 308, the base of the second parasitic BJT 326 is formed by the P-well 304 connected to the second P+ diffusion region 314, and the collector of the second parasitic BJT 326 is formed by the N type semiconductor substrate 302 connected to the fourth N+ diffusion region 318. When a voltage level of the input signal VDD1 is lower than a voltage level of the voltage source VDD2, the Schottky diode 310 conducts charges to make the first parasitic BJT 324 and the second parasitic BJT 326 not conducted. In addition, please note that the above embodiment is only for an illustrative purpose and is not meant to be a limitation of the present invention. For example, the Schottky diode 310 is not limited to be positioned between the first P+ diffusion region 306 and the second P+ diffusion region 308, and the Schottky diode 310 also can be positioned in other positions of the N-well 304.

Figure 6:
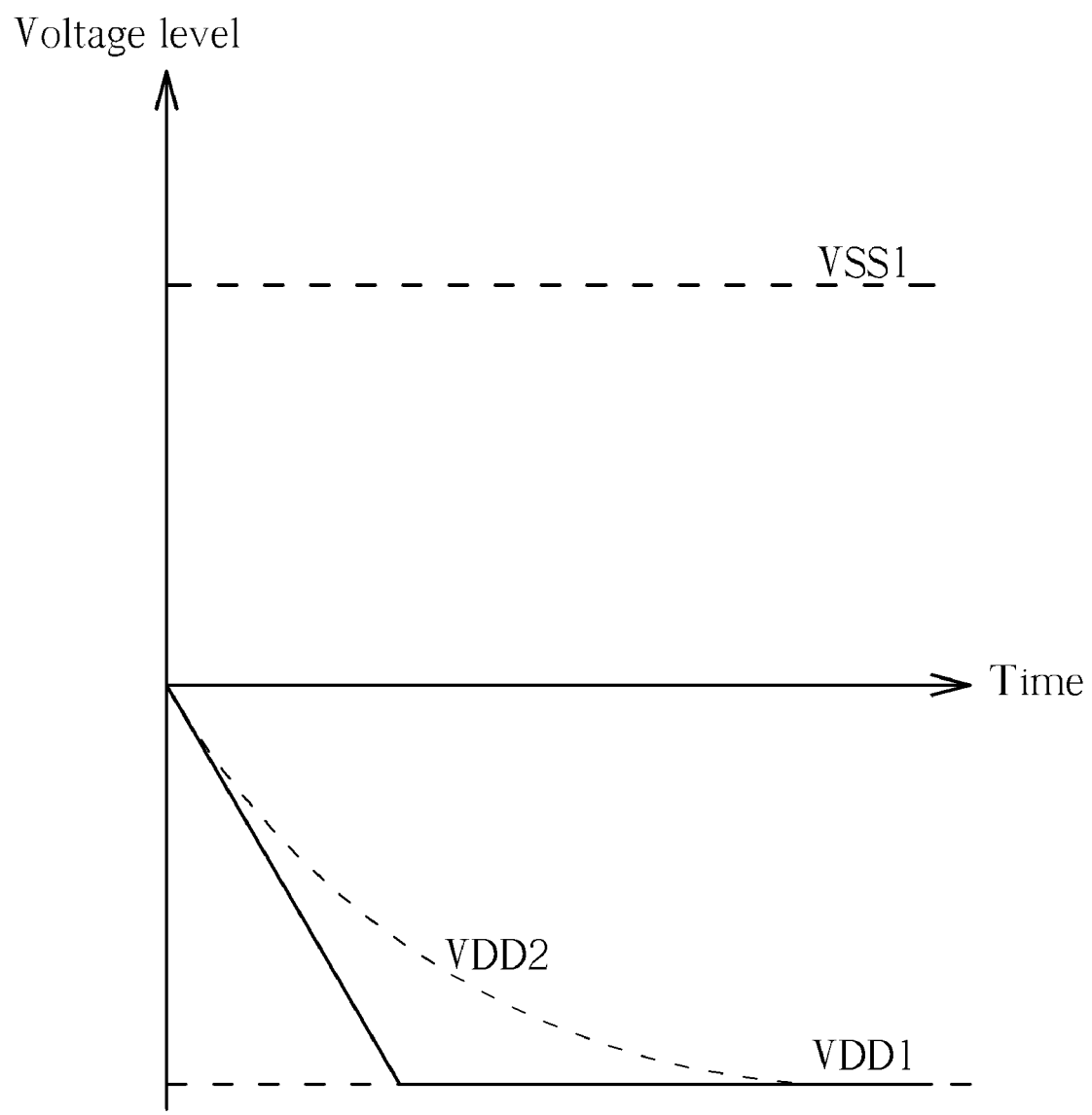
FIG. 6 shows a timing diagram of the voltage level VSS1, the input signal VDD1, and the voltage source VDD2 in the second embodiment of the present invention.

Please refer to FIG. 6. FIG. 6 shows a timing diagram of the voltage level VSS1, the input signal VDD1, and the voltage source VDD2 in the second embodiment of the present invention. As shown in FIG. 6, the voltage level descending speed of the input signal VDD1 is faster than the voltage level descending speed of the voltage source VDD2. However, the forward bias threshold voltage of the Schottky diode 310 in the semiconductor device 300 of the present invention is higher than the forward bias threshold voltages of the first parasitic BJT 324 and the second parasitic BJT 326, and thus when the voltage level of the input signal VDD1 is lower than the voltage level of the voltage source VDD2, the present invention can utilize the Schottky diode 310 to conduct charges so as to make the first parasitic BJT 324 and the second parasitic BJT 326 not conducted. In this way, the semiconductor device 300 of the present invention can prevent the latch-up phenomenon from happening, and thus it is not easy for the semiconductor device 300 of the present invention to be damaged, and the semiconductor device 300 of the present invention has a longer lifetime. In addition, please note that the above embodiment is only for an illustrative purpose and is not meant to be a limitation of the present invention. For example, the concept of the present invention also can be utilized in the semiconductor devices fabricated by other semiconductor processes (such as a high voltage process).

Brief summarized, the semiconductor device disclosed by the present invention can prevent the latch-up phenomenon from happening, and thus it is not easy for the semiconductor device of the present invention to be damaged, and the semiconductor device of the present invention has a longer lifetime.

Those skilled in the art will readily observe that numerous modifications and alterations of the device and method may be made while retaining the teachings of the invention.

What is claimed is:

1. A semiconductor device, comprising:
   a P type semiconductor substrate;
   an N-well, positioned in the P type semiconductor substrate;
   a first P+ diffusion region and a second P+ diffusion region, positioned in the N-well;
   a Schottky diode, positioned in the N-well, for coupled to an input signal;
   a first N+ diffusion region and a second N+ diffusion region, positioned in the N-well, for coupled to a voltage source, respectively;
   a third P+ diffusion region and a fourth P+ diffusion region, positioned in the P type semiconductor substrate;
   a first insulation layer, positioned between the first N+ diffusion region and the third P+ diffusion region;
   a second insulation layer, positioned between the second N+ diffusion region and the fourth P+ diffusion region;
   a first parasitic bipolar junction transistor (BJT), having an emitter, a base, and a collector, wherein the emitter of the first parasitic BJT is formed by the first P+ diffusion region, the base of the first parasitic BJT is formed by the N-well connected to the first N+ diffusion region, and the collector of the first parasitic BJT is formed by the P type semiconductor substrate connected to the third P+ diffusion region; and
   a second parasitic BJT, having an emitter, a base, and a collector, wherein the emitter of the second parasitic BJT is formed by the second P+ diffusion region, the base of the second parasitic BJT is formed by the N-well connected to the second N+ diffusion region, and the collector of the second parasitic BJT is formed by the P type semiconductor substrate connected to the fourth P+ diffusion region;
   wherein when a voltage level of the input signal is higher than a voltage level of the voltage source, the Schottky diode conducts charges to make the first parasitic BJT and the second parasitic BJT not conducted.

2. The semiconductor device of claim 1, being fabricated by a logic process.

3. The semiconductor device of claim 1, being fabricated by a high voltage process.

4. The semiconductor device of claim 1, wherein the Schottky diode is positioned between the first P+ diffusion region and the second P+ diffusion region.

5. A semiconductor device, comprising:
   a N type semiconductor substrate;
   an P-well, positioned in the N type semiconductor substrate;
   a first N+ diffusion region and a second N+ diffusion region, positioned in the P-well;
   a Schottky diode, positioned in the P-well, for coupled to an input signal;

a first P+ diffusion region and a second P+ diffusion region, positioned in the P-well, for coupled to a voltage source, respectively;

a third N+ diffusion region and a fourth N+ diffusion region, positioned in the N type semiconductor substrate;

a first insulation layer, positioned between the first P+ diffusion region and the third N+ diffusion region;

a second insulation layer, positioned between the second P+ diffusion region and the fourth N+ diffusion region;

a first parasitic bipolar junction transistor (BJT), having an emitter, a base, and a collector, wherein the emitter of the first parasitic BJT is formed by the first N+ diffusion region, the base of the first parasitic BJT is formed by the P-well connected to the first P+ diffusion region, and the collector of the first parasitic BJT is formed by the N type semiconductor substrate connected to the third N+ diffusion region; and a second parasitic BJT, having an emitter, a base, and a collector, wherein the emitter of the second parasitic BJT is formed by the second N+ diffusion region, the base of the second parasitic BJT is formed by the P-well connected to the second P+ diffusion region, and the collector of the second parasitic BJT is formed by the N type semiconductor substrate connected to the fourth N+ diffusion region;

wherein when a voltage level of the input signal is lower than a voltage level of the voltage source, the Schottky diode conducts charges to make the first parasitic BJT and the second parasitic BJT not conducted.

6. The semiconductor device of claim 5, being fabricated by a logic process.

7. The semiconductor device of claim 5, being fabricated by a high voltage process.

8. The semiconductor device of claim 5, wherein the Schottky diode is positioned between the first N+ diffusion region and the second N+ diffusion region.

* * * * *